United States Patent
Ishigami et al.

[11] Patent Number: 5,946,192
[45] Date of Patent: Aug. 31, 1999

[54] POWER TRANSISTOR MODULE PACKAGING STRUCTURE

[75] Inventors: Takahiro Ishigami; Hitoshi Tanifuji; Yoshihiko Kikkawa; Yoshihiro Iwasaki; Hiroaki Suzuki; Makoto Tanikawa; Masahito Mori; Isao Kawasaki, all of Tokyo, Japan

[73] Assignee: Mitsubishi Denki Kabushiki Kaisha, Tokyo, Japan

[21] Appl. No.: 08/904,428

[22] Filed: Jul. 31, 1997

[30] Foreign Application Priority Data

Mar. 21, 1997 [JP] Japan ................................ 9-068089

[51] Int. Cl.[6] ............................................. H05K 7/20
[52] U.S. Cl. ......................... 361/704; 257/719; 257/727; 361/690; 361/715
[58] Field of Search .................. 259/718–719; 361/688, 690, 703–704, 707, 709–710, 715–716, 719–721, 730, 752

[56] References Cited

U.S. PATENT DOCUMENTS

| 4,621,304 | 11/1986 | Oogaki et al. ........................ 361/720 |
| 5,339,215 | 8/1994 | Nishiguchi ........................... 361/719 |
| 5,740,013 | 4/1998 | Ruejner et al. ....................... 361/720 |

FOREIGN PATENT DOCUMENTS

| 3219571 | 12/1983 | Germany ............................. 361/688 |
| 2170494 | 7/1990 | Japan ................................. 361/715 |
| 6-123449 | 5/1994 | Japan . |
| 8-86473 | 4/1996 | Japan . |

OTHER PUBLICATIONS

Neumann et al, IBM Tech Discl. Bulletin "Removable Cap for Modules" vol. 24, No. 9 Feb. 1982 pp. 4635–4636. 361/715.

*Primary Examiner*—Gregory Thompson
*Attorney, Agent, or Firm*—Oblon, Spivak, McClelland, Maier & Neustadt, P.C.

[57] ABSTRACT

An apparatus which secures a heat sink to an electrical component connected to a circuit board, including a first outer cover which engages a portion of the heat sink and a portion of the circuit board. In addition, the first outer cover encloses the electrical component, and the electrical component has at least two pins, a first surface facing the circuit board, and a second surface facing the heat sink. Further, a majority of heat dissipating surfaces of the heat sink are outside a space enclosed by the first outer cover and the circuit board.

22 Claims, 3 Drawing Sheets

POWER TRANSISTOR MODULE PACKAGING STRUCTURE

FIELD OF THE INVENTION

The present invention relates to a power transistor module packaging structure, and more particularly to a packaging structure for a printed wiring board of a power transistor module, such as a power transistor module used for inverter control, on which a radiation heat sink is mounted.

BACKGROUND OF THE INVENTION

A known power transistor module packaging structure for inverter control which can mount thereon a radiation heat sink, is a three-dimensional solid structure as disclosed in the Japanese Patent Laid-Open No. HEI 8-86473 and one having a multi-layered structure as disclosed in the Japanese Patent Laid-Open No. HEI 6-123449.

FIG. 4 shows the power transistor module packaging structure according to the Japanese Patent Laid-Open Publication No. HEI 8-86473. Disclosed in the publication is a power transistor module 100 which employs SIP (Single In-Line Package) having only a single line of hook-shaped lead pins 101 and is placed, by lead pins 101 extending in the side of a side section crossing at right angles a heat-sink mounted surface 102 and by way of the lead-through packaging method, at a position adjacent to an edge of a printed wiring board 103 in erect posture against a surface 104 of the printed wiring board 103 on which other electric components are packaged, and a radiation heat sink 105 is placed on the heat-sink mounted surface 102.

Electric connection between the power transistor module 100 and the printed wiring board 103 is realized with the lead pins 101. However, when the radiation heat sink 105 is mounted on the power transistor module 100, the weight of the assembly becomes heavy, which can not be supported only by the single line of lead pins 101, and for this reason, the power transistor module 100 and the radiation heat sink 105 are screwed into a supporting tool (a package mounting member) 106 and into the printed wiring board 103 so that the lead pins 101 will not be distorted or buckled when packaged due to the weight of the power transistor module 100 together with the radiation heat sink 105. Namely, the power transistor module 100 and the radiation heat sink 105 are mounted on the printed wiring board 13 with the supporting tool 106.

FIG. 5 shows the power transistor module packaging structure according to the Japanese Patent Laid-Open Publication No. HEI 6-123449. Disclosed in the publication is a power transistor module 200 which employs DIP (Dual In-Line Package) having two lines of hook-shaped lead pins 202 arranged on a surface of the. transistor module reverse to a heat-sink mounted surface 201. The module 200 is packaged, by the two lines of lead pins 202 and also by way of the lead-through packaging method, on the surface reverse to a surface 206 of the printed wiring board 203 on which other electric components 204, 205 or the like are packaged. The printed wiring board 203 is electrically connected to a molded board 207 and is also mounted on the molded board 207 by a section 208 for the electric connection, and a radiation heat sink 209 in a state of being mounted on this molded board 207 contacts the heat-sink mounted surface 201 of the power transistor module 200.

It should be noted that a control board (printed wiring board) 210 is mounted on the side reverse to the side where the radiation heat sink of the molded board (printed wiring board) 207 is mounted, so that the molded board 207 and the control board 210 constitute a two-layered structure.

In the power transistor module packaging structure disclosed in Japanese Patent Laid-Open No. HEI 8-86473, the supporting tool 106 as a separate component specifically used for mounting is required for mounting the power transistor module 100 as well as the radiation heat sink 105 onto the printed wiring board 103, so that the number of units of component and the number of assembling steps increase in the power transistor module packaging structure, and in addition, workability in the maintenance service therefor is inefficient.

In the power transistor module packaging structure disclosed in Japanese Patent Laid-Open No. HEI 6-123449, a power transistor module 200 is fixed to the printed wiring board 203 by the two lines of lead pins 202 by way of the lead-through packaging method, so that any particular component specifically used for mounting of the module or the like thereonto is not required, but the power transistor module 200 is packaged, due to the multi-layered structure, on a surface reverse to the surface 206 on which other electric components 204, 205 or the like are packaged, so that a lead-through soldering is required on two surfaces, one for the other electric components 204, 205 or the like and the other for the power transistor module 200, which disadvantageously results in an increase in the number of soldering steps.

In any of the modules based on the conventional technology, the radiation heat sinks 105, 209 are additionally supported by the board separately from the power transistor modules 100, 200, and the radiation heat sinks 105, 209 are contacted to the power transistor modules 100, 200 for thermal conduction according to a decided positional relation therebetween depending on the mounted positions of the two components, so that the radiation heat sinks 105, 209 and the power transistor modules 100, 200 are not contacted to each other for appropriate thermal conduction due to, for instance, errors in mounting positions for the radiation heat sinks 105, 209 as well as for power transistor modules 100, 200, so that the radiation heat sinks 105, 209 do not effectively function, which may cause overheating in the power transistor modules 100, 200.

SUMMARY OF THE INVENTION

It is an object of the present invention to obtain a power transistor module packaging structure which does not require any specific parts used only for mounting a power transistor module or a radiation heat sink, nor one which requires an increased number of soldering steps for assembly and maintenance works, and also which can ensure an appropriate joint between the radiation heat sink and a power transistor module for appropriate thermal conduction with high reliability.

In order to achieve the objects as described above, the power transistor module packaging structure according to the present invention has at least two lines of lead pins extending on a surface reverse to a radiation base plate provided on the other side of the power transistor module, and the power transistor module is fixed, by at least these two lines of lead pins and by way of the lead-through packaging method, on the same surface of a printed wiring board as that on which other electric components thereof are lead-through-packaged, and a radiation heat sink is fixed and mounted on the radiation base plate of the power transistor module.

In the power transistor module packaging structure according to the present invention, the power transistor module is packaged, by at least two lines of lead pins and by way of the lead-through packaging method, on the same surface as the surface of the printed wiring board on which other electric components are lead-through-packaged, and the radiation heat sink is fixed to the radiation base plate on the power transistor module. In this case, at least two lines of lead pins in a two-legged shape support the power transistor module with a radiation heat sink, so that the lead pins are designed to have mechanical strength enough for resisting against shock and vibration loaded to the radiation heat sink as a whole.

In the power transistor module packaging structure according to another feature of the present invention, in the power transistor module packaging structure according to the above invention, the power transistor module comprises a dual inline package (DIP) having two lines of inline lead pins extending on a surface reverse to the other surface thereon on which the radiation base plate is provided from places adjacent to both side edges of the surface section reverse to the surface with the radiation base plate provided thereon respectively.

In the power transistor module packaging structure according to this invention, the power transistor module is of a DIP type and is packaged, by the two lines of inline lead pins and by way of the lead-through packaging method, on the same surface as a surface of the printed wiring board on which other electric components are lead-through-packaged, and the radiation heat sink is fixed to the radiation base plate on the power transistor module. In this case, two lines of inline lead pins in a two-legged shape support the power transistor module with a radiation heat sink, so that the lead pins are designed to have mechanical strength enough for resisting against shock and vibration loaded to the radiation heat sink as a whole.

In the power transistor module packaging structure according to another feature of the present invention, in the power transistor module packaging structure according to the above invention, the power transistor module comprises a dual inline package (DIP) having two lines of hook-shaped lead pins extending from both of side faces thereof to the opposite side to the radiation base plate respectively.

In the power transistor module packaging structure according to this invention, the power transistor module is also the DIP type thereof and is packaged, by the two lines of hook-shaped lead pins and by way of the lead-through packaging method, on the same surface as the surface of the printed wiring board on which other electric components are lead-through-packaged and the radiation heat sink is fixed to the radiation base plate on the power transistor module. In this case, two lines of hook-shaped lead pins in a two-legged shape support the power transistor module with a radiation heat sink, so that the lead pins are designed to have mechanical strength enough for resisting against shock and vibration loaded to the radiation heat sink as a whole.

The power transistor module packaging structure according to another feature of the present invention has a box-shaped cover member to be fixed and mounted onto the printed wiring board to cover therewith an electric-components packaged section on the printed wiring board, and the cover member is built so that it can additionally support the radiation heat sink.

In the power transistor module packaging structure according to this invention, the electric-components packaged section of the printed wiring board is covered and protected by the box-shaped cover member which also additionally supports the radiation heat sink, so that the mounting strength of a combination body of the radiation heat sink and power transistor module is enhanced.

In the power transistor module packaging structure according to another feature of the present invention, in the power transistor module packaging structure according to the above invention, the power transistor module is provided for inverter-controlling an electric motor for driving a compressor of an air conditioner.

In the power transistor module packaging structure according to this invention, the power transistor module for inverter-controlling an electric motor for driving a compressor of an air conditioner is packaged.

Other objects and features of this invention will become understood from the following description with reference to the accompanying drawings. dr

DESCRIPTION OF THE PREFERRED EMBODIMENTS

Detailed description is made hereinafter for embodiments of the power transistor module packaging structure according to the present invention with reference to the attached drawings.

Figure 1:
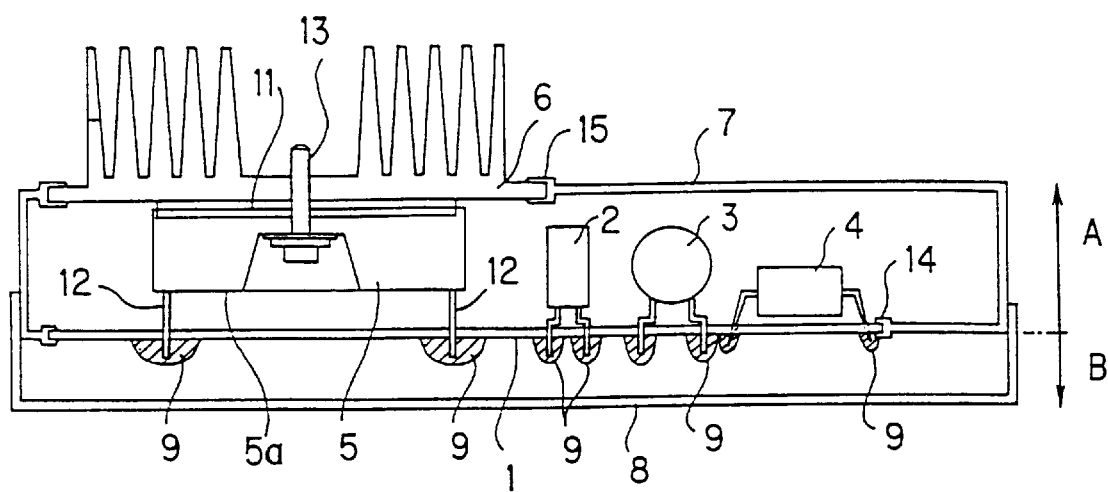
FIG. 1 is a cross-sectional view showing Embodiment 1 in which the power transistor module packaging structure according to the present invention is applied to that for inverter-controlling an electric motor for driving a compressor of an air conditioner.

FIG. 1 shows Embodiment 1 in which the power transistor module packaging structure according to the present invention is applied to that for inverter-controlling an electric motor for driving a compressor of an air conditioner.

In FIG. 1, designated at the reference numeral 1 is a printed wiring board, at 2, 3, 4 electric components such as capacitors and resistors or the like each packaged on the surface A of the printed wiring board 1 in a lead-through packaging method respectively, at 5 a power transistor module packaged on the surface A of the printed wiring board 1 in the lead-through packaging method, at 6 a radiation heat sink, at 7 a top cover member, at 8 a bottom cover member, and at 9 a soldered land section according to the lead-through packaging.

Herein, the lead-through packaging is, as well-known, a packaging structure in which lead pins of electric components with leads are passed through lead-through holes formed by penetrating the printed wiring board, are soldered on conductor pattern sections of the printed wiring board onto the side of the rear surface (surface B), and the electric components with leads are electrically connected to the printed wiring board by the soldering and are mechanically fixed thereto.

The power transistor module 5, which is for controlling an inverter, has a plurality units of switching element (not shown herein) inside the package, and generates a false AC current at an arbitrary voltage and an arbitrary frequency by switching a DC current loaded thereto.

The power transistor module 5 has a radiation base plate 11 fixed and mounted onto one surface thereof, and comprises a dual inline package (DIP) having two lines of inline lead pins 12 each in erect position and extending on a surface reverse to the other surface thereof with the radiation base plate 11 provided thereon from places adjacent to both of the edges of the surface (bottom surface) 5a reverse to the surface with the radiation base plate 11 provided thereon, and is fixed, by the two lines of lead pins 12 and by way of the lead-through packaging method, onto the same surface surface A of the printed wiring board as a surface surface A thereof on which other electric components 2, 3, 4 are lead-through-packaged.

With this feature, the soldered surface for lead-through packaging of the power transistor module 5 is the same surface as the surface B on which each of other electric components 2, 3, 4 is soldered, so that the soldering land section 9 of the power transistor module 5 as well as each land section 9 for other electric components 2, 3, 4 exist on the same surface B. As a result, it is possible to perform soldering for the power transistor module 5 as well as for those of other electric components 2, 3, 4 in one soldering process.

The radiation heat sink 6 is directly screwed in the radiation base plate 11 on the power transistor module 5 with a bolt 13 by contacting the surfaces thereof to each other.

In this case, a contact degree between the radiation heat sink 6 and power transistor module 5, which decides a degree of a thermal conductivity therebetween, is decided depending on tightening force of the bolt 13, and an appropriate thermal conductivity therebetween can be insured by setting tightening force of the bolt 13 to an appropriate value.

In the packaging structure described above, two lines of inline lead pins 12 in a two-legged shape support a power transistor module 5 with a radiation heat sink, so that the lead pins 12 are designed to have mechanical strength, in total of the two lines, enough for resisting against shock and vibration loaded to the radiation heat sink 6.

The top cover member 7 is molded to a box shape with an electrically insulating material such as plastics or the like, is engaged with a peripheral edge section of the printed wiring board by inserting an engagement section 14 thereof, and covers an electric components packaged section (the side of a surface A) of the printed wiring board in a sealed structure in the state where the top cover member 7 is tightly fixed and mounted onto the printed wiring board 1 because of this inserted engagement. With this feature, the electric component packaged section is protected.

Formed in the top cover member 7 is an opening 15 for attaching the radiation heat sink 6 thereto, and the peripheral section of the radiation heat sink 6 is inserted into and engaged with this opening 15 for attachment. With this engagement, the top cover member 7 additionally supports the radiation heat sink 6, which makes it possible to enhance mounting strength of a combination body of the radiation heat sink 6 and power transistor module 5.

The bottom cover member 8 is attached to the side of the surface B of the printed wiring board 1 to protect soldered portions.

In addition, it should be noted that a majority of heat dissipating surfaces of the heat sink are outside a space enclosed by the top cover member 7 and the circuit board 1. Thus, the heat generated by the power transistor module 5 is directly transferred out of the enclosed space and away from the other electrical components 2, 3, 4.

With the features described above, it is possible to obtain a packaging structure which does not require any specific parts used only for mounting the power transistor module 5 or the radiation heat sink 6 and is excellent in adaptability for assembling and maintenance work without increasing the number of soldering steps.

It should be noted that the assembling steps may be performed in the order of (1) setting electric components 2, 3, 4 onto the printed wiring board 1, (2) setting the power transistor module 5 onto the printed wiring board 1, (3) soldering the electric components 2, 3, 4 as well as the power transistor module 5 simultaneously, (4) tightening the radiation heat sink 6 with a screw, and (5) mounting the top cover member 7 and the bottom cover member 8.

Figure 2:
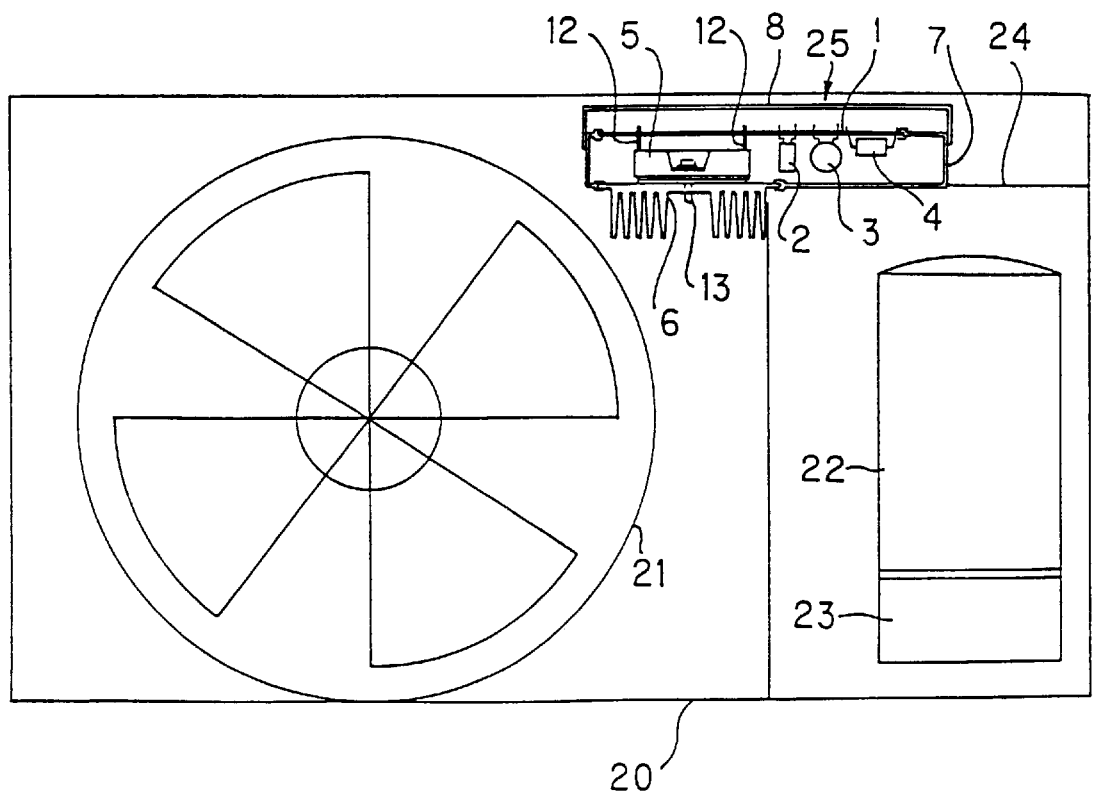
FIG. 2 is an explanatory view showing a state in which a unit comprising the power transistor module packaging structure according to the present invention is incorporated in outdoor equipment for an air conditioner as one for inverter-controlling an electric motor for driving a compressor of the air conditioner.

FIG. 2 shows an embodiment in which the power transistor module packaging unit (electric box) for controlling an inverter is incorporated in outdoor equipment for an air conditioner as one for inverter-controlling an electric motor for driving a compressor of the air conditioner. In FIG. 2, designated at the reference numeral 20 is a unit casing for outdoor equipment, at 21 a fan, at 22 a compressor, at 23 an electric motor for driving the compressor, at 24 a cover for a machine room, and at 25 a power transistor module packaging unit.

The power transistor module packaging unit 25 is fixed onto the machine room cover 24 with the top cover member 7 in posture of being upside down thereof.

In this case, the top cover member 7 supports the printed wiring board 1 and the radiation heat sink 6, whereby the mounting strength for those components can be enhanced.

Figure 3:
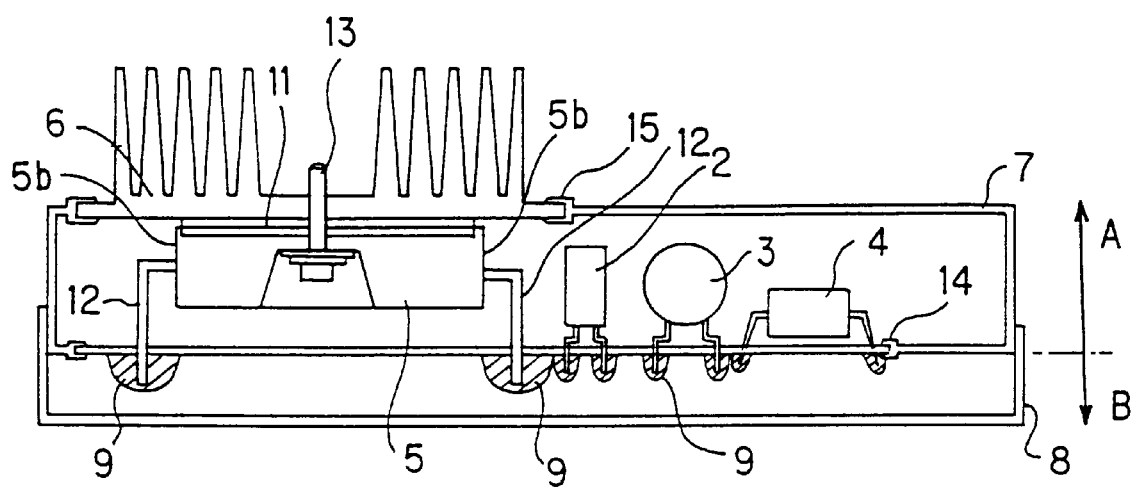
FIG. 3 is a cross-sectional view showing Embodiment 2 in which the power transistor module packaging structure according to the present invention is applied to that for inverter-controlling an electric motor for driving a compressor of an air conditioner.
Figure 4:
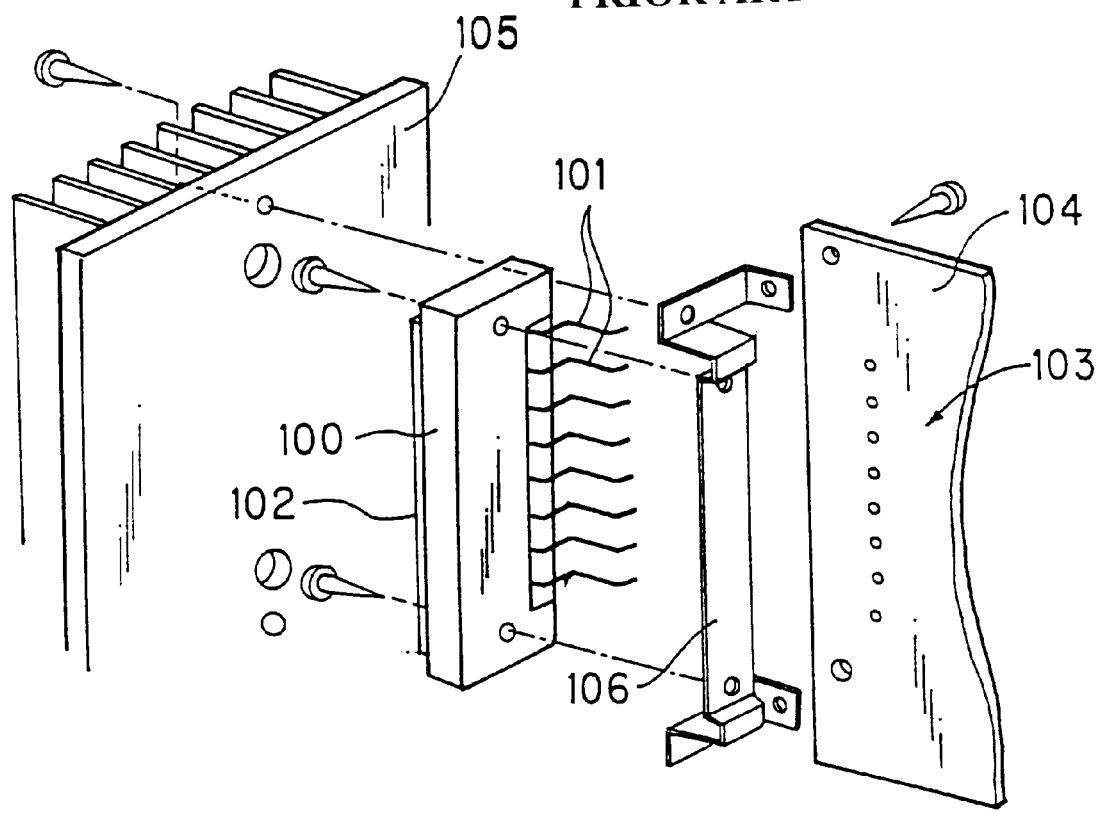
FIG. 4 is a perspective view showing the power transistor module packaging structure based on conventional technology.
Figure 5:
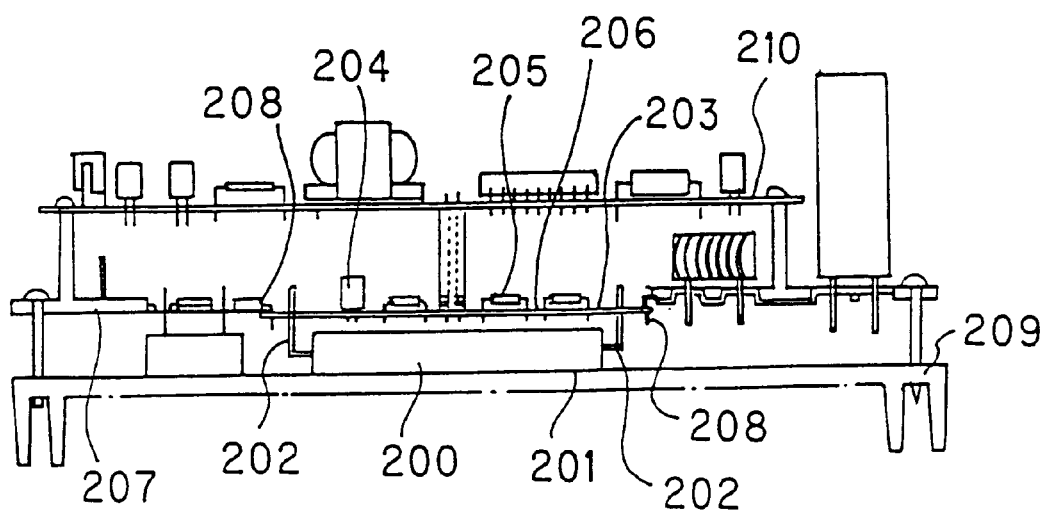
FIG. 5 is a cross-sectional view showing the power transistor module packaging structure based on conventional technology.

FIG. 3 shows Embodiment 2 in which the power transistor module packaging structure according to the present invention is applied to that for inverter-controlling an electric motor for driving a compressor of an air conditioner. It should be noted that, in FIG. 3, the same reference numerals are assigned to the sections corresponding to those in FIG. 1, and description thereof is omitted herein.

In this embodiment, the power transistor module 5 comprises a dual inline package (DIP) having two lines of hook-shaped lead pins extending from both of side sections thereof 5b on S a surface reverse to the other surface thereof with the radiation base plate 11 provided thereon respectively, and is fixed, by the two lines of lead pins 12 and by way of the lead-through packaging method, onto the same surface of the printed wiring board 1 (surface A) as a surface (surface A) thereof on which other electric components 2, 3, 4 are lead-through-packaged like in a case of Embodiment 1.

With this feature, also in Embodiment 2, the soldered surface for lead-through packaging of the power transistor module 5 is the same surface as the surface B on which each of other electric components 2, 3, 4 is soldered, so that the soldered land section 9 of the power transistor module 5 as well as each land section 9 of other electric components 2, 3, 4 exist on the same surface B, and for this reason, it is possible to solder the power transistor module 5 as well as other electric components 2, 3, 4 in one soldering process.

Also in Embodiment 2, the radiation heat sink 6 is directly screwed into the radiation base plate 11 on the power transistor module 5 with the bolt 13 by contacting the surfaces thereof. In this case, a degree of contact between the radiation heat sink 6 and power transistor module 5 for deciding a degree of a thermal conductivity therebetween is also decided depending on tightening force of the bolt 13, and an appropriate thermal conductivity between the radiation heat sink 6 and the power transistor module 5 can be insured by setting a tightening force of the bolt 13 to an appropriate value.

In the packaging structure described above, the two lines of hook-shaped lead pins 12 in a two-legged shape support a power transistor module 5 with a radiation heat sink, so that the lead pins 12 are designed to have mechanical strength enough for resisting against shock and vibration loaded to the radiation heat sink 6 in total of the two lines.

Formed in the top cover member 7 is an opening 15 for attaching the radiation heat sink 6 thereto like in Embodiment 1, and the peripheral section of the radiation heat sink 6 is inserted into and engaged with this opening 15 for attachment. With this feature, the top cover member 7 additionally supports the radiation heat sink 6, which makes it possible to enhance mounting strength of a combination body of the radiation heat sink 6 and power transistor module 5.

With the features described above, in Embodiment 2, it is also possible to obtain a packaging structure which is excellent in adaptability for assembling and maintenance service therefor without requiring any particular component used only for mounting of a power transistor module 5 and a radiation heat sink 6, and also without increasing the number of soldering steps.

It should be noted that the mounting steps may also be performed, like in a case of Embodiment 1, in the order of (1) setting electric components 2, 3, 4 onto the printed wiring board 1, (2) setting the power transistor module 5 onto the printed wiring board 1, (3) soldering the electric components 2, 3, 4 and the power transistor module 5 thereonto simultaneously, (4) screwing the radiation heat sink 6, and (5) mounting the top cover member 7 and the bottom cover member 8.

As understood from the above description, with the power transistor module packaging structure according to the present invention, a power transistor module is packaged, by at least two lines of lead pins in a lead-through packaging method, on the same surface as a surface of the printed wiring board on which other electric components are lead-through-packaged, and a radiation heat sink is fixed to a radiation base plate on the power transistor module, so that it is possible to obtain a power transistor module packaging structure which does not require any particular component used only for mounting a power transistor module and a radiation heat sink, nor one which increases the number of soldering steps, is low in cost and excellent in adaptability for assembling and maintenance service therefor, and ensures appropriate thermal conductivity between the radiation heat sink and the power transistor module with high reliability.

With the power transistor module packaging structure according to another feature of the present invention, the DIP type of power transistor module is packaged, by two lines of inline lead pins and by way of the lead-through packaging method, on the same surface as a surface of the printed wiring board on which other electric components are lead-through-packaged, and a radiation heat sink is fixed to the radiation base plate on the power transistor module, so that it is possible to obtain a power transistor module packaging structure which does not require any particular component used only for mounting of a power transistor module and a radiation heat sink, nor one which increases the number of soldering steps, is low in cost and excellent in adaptability for assembling and maintenance service therefor, and ensures appropriate thermal conductivity between the radiation heat sink and the power transistor module with high reliability.

With the power transistor module packaging structure according to another feature of the present invention, the DIP type of power transistor module is packaged, by two lines of hook-shaped lead pins and by way of the lead-through packaging method, on the same surface as the surface of the printed wiring board on which other electric components are lead-through-packaged and a radiation heat sink is fixed to a radiation base plate on the power transistor module, so that it is possible to obtain a power transistor module packaging structure which does not require any particular component used only for mounting of a power transistor module and a radiation heat sink, nor one which increases the number of soldering steps, is low in cost and excellent in adaptability for assembling and maintenance service therefor, and ensures appropriate thermal conductivity between the radiating heat sink and the power transistor module with high reliability.

With the power transistor module packaging structure according to another feature of the present invention, an electric-components packaged section of a printed wiring board is covered and protected by a box-shaped cover member which also additionally supports a radiation heat sink, so that the mounting strength of a combination body of the radiation heat sink and power transistor module is enhanced.

With the power transistor module packaging structure according to another feature of the present invention, packaging of the power transistor module for inverter-controlling an electric motor for driving a compressor of an air conditioner is performed and packaging of the power transistor module in an air conditioner based on an inverter-control system is performed without requiring any particular component used only therefor as well as increasing soldering steps, whereby a low-cost power transistor module packaging structure excellent in adaptability for assembling and maintenance service can be obtained. The power transistor module packaging structure also ensures appropriate thermal conductivity between the radiation heat sink and the power transistor module without fail.

This application is based on Japanese patent application No. HEI 9-68089 filed in the Japanese Patent Office on Mar. 21, 1997, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art. which fairly fall within the basic teaching herein set forth.

What is claimed is:

1. An apparatus which secures a heat sink to an electrical component connected to a circuit board, comprising:

a first outer cover which engages a portion of said heat sink and a portion of said circuit board, said first outer cover enclosing said electrical component;

said electrical component having at least two pins, a first surface facing said circuit board, and a second surface facing said heat sink; and a fastener having an engaging face on a pin side of the electrical component and a shaft extending into the heat sink to squeeze the electrical component from the pin side of the electrical component against the heat sink, wherein a majority of heat dissipating surfaces of the heat sink are outside a space enclosed by the first outer cover and the circuit board.

2. An apparatus according to claim 1, wherein said first surface of said electrical component faces a top surface of said circuit board having at least one other electrical component thereon.

3. An apparatus according to claim 1, wherein said electrical component comprises a power module.

4. An apparatus according to claim 1, wherein said first outer cover supports said heat sink.

5. An apparatus according to claim 1, wherein said at least two pins of said electrical component extend substantially perpendicular to said first surface of said electrical component and connect said electrical component to said circuit board.

6. An apparatus according to claim 1, wherein said at least two pins of said electrical component comprise hook-shaped pins.

7. An apparatus according to claim 1, further comprising a base plate disposed between said second surface of said electrical component and said heat sink.

8. An apparatus according to claim 1, wherein said heat sink comprises a plurality of fins substantially perpendicular to said first outer cover.

9. An apparatus according to claim 2, further comprising a second outer cover engaged with said first cover and covering a bottom surface of said circuit board.

10. An apparatus according to claim 1, wherein said first outer cover comprises a box shape.

11. An apparatus according to claim 9, wherein said second outer cover comprises a box shape.

12. An apparatus according to claim 1, wherein the first outer cover supports the heat sink.

13. An apparatus according to claim 1, wherein the first outer cover includes an opening with prongs which engage edges of the heat sink.

14. A power transistor module package, comprising:
a circuit board having mounted thereon a power transistor module;
a heat sink secured to said power transistor module;
a first outer cover which engages a portion of said heat sink and a portion of said circuit board, said first outer cover enclosing said power transistor module;
said power transistor module having at least two pins, a first surface facing said circuit board, and a second surface facing said heat sink; and
a fastener having an engaging face on a pin side of the power transistor module and a shaft extending into the heat sink to squeeze the power transistor module from the pin side of the power transistor module against the heat sink;
wherein a majority of heat dissipating surfaces of the heat sink are outside a space enclosed by the first outer cover and the circuit board.

15. A package according to claim 14, wherein said first surface of said power transistor module faces a top surface of said circuit board having at least one other electrical component thereon.

16. A package according to claim 14, wherein said first outer cover supports said heat sink.

17. A package according to claim 14, further comprising a base plate disposed between said second surface of said power transistor module and said heat sink.

18. A package according to claim 14, wherein said heat sink comprises a plurality of fins substantially perpendicular to said first outer cover.

19. A package according to claim 15, further comprising a second outer cover engaged with said first cover and covering a bottom surface of said circuit board.

20. A package according to claim 14, wherein said at least two pins of said power transistor module extend substantially perpendicular to said first surface of said power transistor module and connect said power transistor module to said circuit board.

21. An apparatus according to claim 14, wherein the first outer cover supports the heat sink.

22. An apparatus according to claim 14, wherein the first outer cover includes an opening with prongs which engage edges of the heat sink.

* * * * *

UNITED STATES PATENT AND TRADEMARK OFFICE
CERTIFICATE OF CORRECTION

PATENT NO. : 5,946,192
DATED : August 31, 1999
INVENTOR(S) : Takahiro ISHIGAMI, et al.

It is certified that error appears in the above-identified patent and that said Letters Patent is hereby corrected as shown below:

On the title page, item [45] should be:

--[45]  Date of Patent:   *Aug. 31, 1999--

On the title page, the Continued Prosecution Application Information should read as follows:

--[*]  Notice:  This patent issued on a continued prosecution application filed under 37 CFR 1.53(d), and is subject to the twenty year patent term provisions of 35 U.S.C. 154(a)(2).--

Signed and Sealed this

Twenty-sixth Day of September, 2000

Attest:

Q. TODD DICKINSON

*Attesting Officer*         *Director of Patents and Trademarks*